United States Patent
Lillestolen

(10) Patent No.: US 8,856,708 B1
(45) Date of Patent: Oct. 7, 2014

(54) MULTI-TIER FIELD-PROGRAMMABLE GATE ARRAY HARDWARE REQUIREMENTS ASSESSMENT AND VERIFICATION FOR AIRBORNE ELECTRONIC SYSTEMS

(71) Applicant: Hamilton Sundstrand Corporation, Windsor Locks, CT (US)

(72) Inventor: Kirk A. Lillestolen, East Hartland, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 13/940,863

(22) Filed: Jul. 12, 2013

(51) Int. Cl.
*G06F 17/50* (2006.01)

(52) U.S. Cl.
CPC ........ *G06F 17/5027* (2013.01); *G06F 17/5045* (2013.01)
USPC ........................................... 716/113; 716/112

(58) Field of Classification Search
CPC .................................. G06F 17/30; G06F 17/50
USPC ............................................................ 716/113
See application file for complete search history.

(56) References Cited

U.S. PATENT DOCUMENTS

| | | | |
|---|---|---|---|
| 2004/0243955 A1* | 12/2004 | Alpert et al. | 716/6 |
| 2005/0216109 A1* | 9/2005 | Radigan et al. | 700/97 |
| 2010/0199237 A1* | 8/2010 | Kim et al. | 716/3 |

* cited by examiner

*Primary Examiner* — Vuthe Siek
*Assistant Examiner* — Mohammed Alam
(74) *Attorney, Agent, or Firm* — Kinney & Lange, P.A.

(57) ABSTRACT

A method of verifying a field programmable gate array for use in an integrated system includes selecting, from a set of requirements of the field programmable gate array, a first subset of the requirements that are not influenced by dynamics of the integrated system; selecting, from the set of requirements of the field programmable gate array, a second subset of the requirements that are influenced by the dynamics of the integrated system; executing a hardware test on the field programmable gate array using a chip tester that verifies the first subset of the requirements; and executing a hardware test on the field programmable gate array to verify the second subset of the requirements while the field programmable gate array is installed within the integrated system.

16 Claims, 3 Drawing Sheets

US 8,856,708 B1

MULTI-TIER FIELD-PROGRAMMABLE GATE ARRAY HARDWARE REQUIREMENTS ASSESSMENT AND VERIFICATION FOR AIRBORNE ELECTRONIC SYSTEMS

BACKGROUND

The present invention is related to hardware verification, and in particular to a method of assessing and verifying field programmable gate array (FPGA) requirements for airborne electronic systems.

FPGAs are utilized in a variety of applications, including, for example, electronic systems of aircraft. Verifying the functionality of these FPGAs is an important process. The verification process includes verifying that the physical device properly implements the FPGA's requirements and verifying the physical device properly integrates with the system.

Hardware test criteria may be defined by, for example, Radio Technical Commission for Aeronautics (RTCA) industry standard DO-254, which defines design assurance guidance for airborne electronic hardware. The DO-254 standard includes specification for requirements-based hardware verification as well as robustness-based verification. Requirements-based verification includes verifying the requirements that define the operation of the FPGA. Robustness-based verification addresses boundary and abnormal operating conditions.

SUMMARY

A method of verifying a field programmable gate array for use in an integrated system includes selecting, from a set of requirements of the field programmable gate array, a first subset of the requirements that are not influenced by dynamics of the integrated system; selecting, from the set of requirements of the field programmable gate array, a second subset of the requirements that are influenced by the dynamics of the integrated system; executing a hardware test on the field programmable gate array using a chip tester that verifies the first subset of the requirements; and executing a hardware test on the field programmable gate array to verify the second subset of the requirements while the field programmable gate array is installed within the integrated system.

DETAILED DESCRIPTION

A method for assessing and verifying requirements of field programmable gate arrays (FPGAs) for airborne electronic systems is disclosed herein that includes selecting requirements for hardware testing through either a chip-level tester, full integrated system testing, or both. Analysis is done on the FPGA requirements to determine the "intended operational environment" for each requirement. Those that do not depend upon the dynamics of the system into which the FPGA is being integrated are performed and verified using standalone chip testing. Full system integration testing is then utilized to verify the requirements that are dependent upon the dynamics of the system into which the FPGA is integrated. In the past, certification bodies have not allowed the use of chip-level testing for verification of FPGAs for airborne electronic systems. By assessing each FPGA requirement, and using standalone chip testing to verify requirements that are not influenced by the dynamics of the system, airborne electronic hardware certification requirements may be met while greatly reducing the amount of test cases that need to be verified using full system integrated testing. Full system integrated testing is a costly and time consuming process. Reducing the amount of FPGA requirements that need to be verified using full system integrated testing greatly reduces the time and cost of verifying an FPGA.

Figure 1:
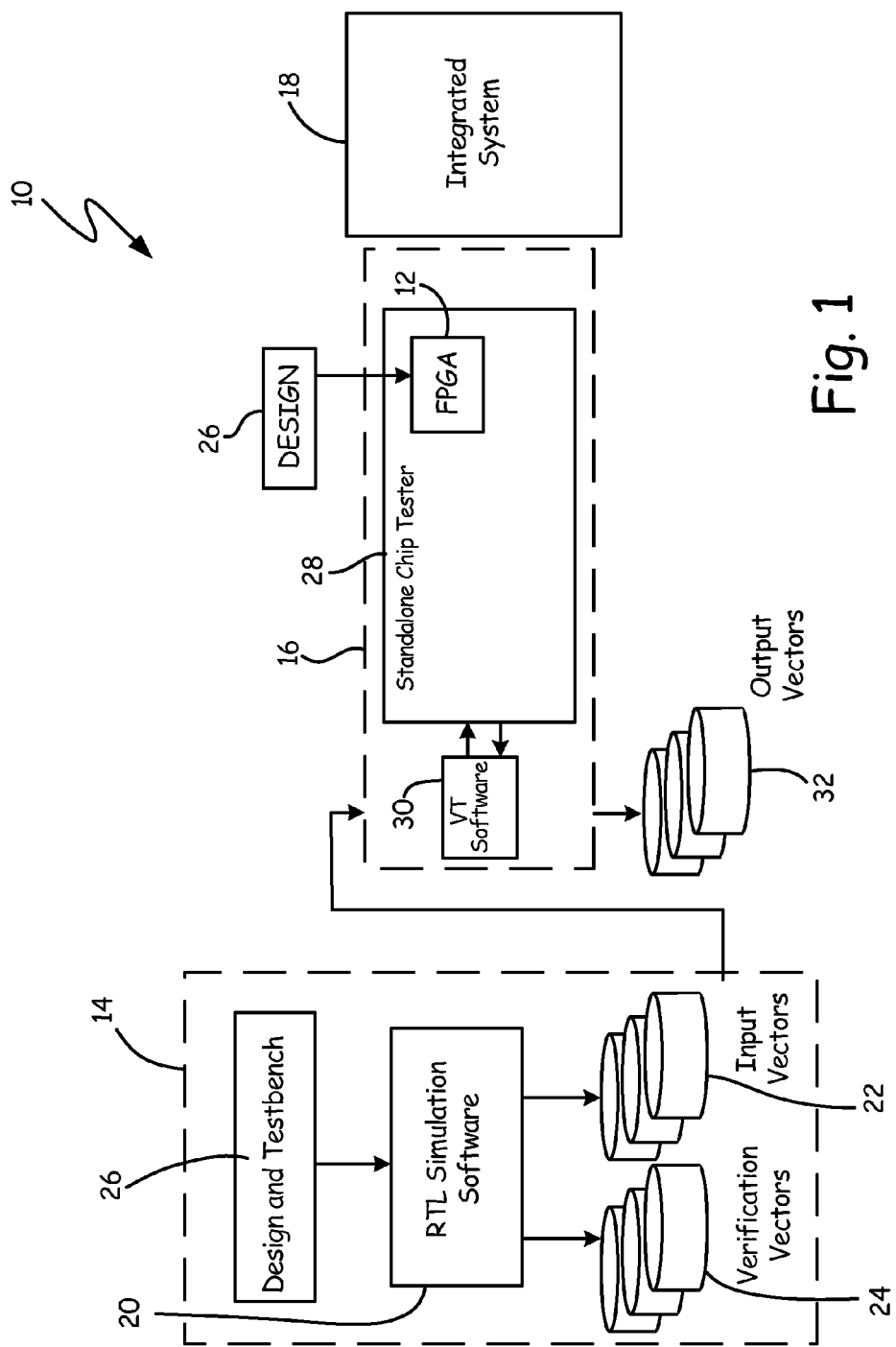
FIG. 1 is a diagram illustrating a system for performing verification of a field-programmable gate array.

FIG. 1 is a block diagram illustrating system 10 for performing verification of FPGA 12. System 10 includes simulation environment 14, standalone chip testing environment 16, and integrated system 18. Simulation environment 14 includes register-transfer level (RTL) simulation software 20, input vectors 22, verification vectors 24, and design and test bench 26. Simulation environment 14 may be implemented on, for example, a first computer system. Standalone chip testing environment 16 includes standalone chip tester 28, and vector test software 30. Standalone chip testing environment 16 may be implemented in, for example, a second computer system. Standalone chip tester 28 may be any hardware capable of interfacing with FPGA 12 to provide full control over the inputs and outputs of FPGA 12. Standalone chip testing environment 16 produces output vectors 32. The first computer system and the second computer system may or may not be implemented as the same computer system. Integrated system 18 may be, for example, an aircraft gas turbine engine control system or any other system for which FPGA 12 was designed. Although illustrated as interfaced standalone chip tester 28, FPGA 12 is installed within integrated system 18 during full system integration testing. While illustrated as a system for verifying an FPGA, system 10 could also be utilized to verify any digital logic circuit for use in integrated system 18.

Simulation environment 14 is used to verify the design-under-test (DUT) in software. Design and test bench 26 is, for example, an electronic document that includes the DUT for FPGA 12 as well as a test bench. The DUT may be specified, for example, using a hardware description language (HDL). RTL simulation software 20 loads design and test bench 26 to test and verify the DUT in simulation. Testing and verification in simulation is accomplished using any known method. RTL simulation software 20 is any simulation software capable of simulating a hardware design based upon the HDL specified in the DUT. While described as simulation software at the register-transfer level, simulation software 20 may be any software capable of simulating the DUT at any degree of physical abstraction.

RTL simulation software 20 creates input vectors 22 and verification vectors 24. Input vectors 22 are created based upon the test bench specified in design and test bench 26. Input vectors 22 represent the state of the input pins of FPGA 12. Verification vectors 24 correspond to the state of the output pins of FPGA 12 for each of the respective input vectors 22. Verification vectors 24 are generated by RTL simulation software 20 during simulation and testing of the FPGA design. RTL simulation software 20 verifies that the DUT properly implements requirements of the design of FPGA 12.

Standalone chip testing environment 16 is a hardware environment used to verify the hardware implementation of design 26 on FPGA 12 for requirements for which the intended operational environment is not dependent upon the system in which FPGA 12 is integrated. Standalone chip testing environment 16 is any environment capable of chip-level testing of FPGA 12. In an embodiment, FPGA 12 is configured using a "burn file" that is based upon the DUT using any known synthesis tool and place-and-route tool. FPGA 12 is installed/connected to standalone chip tester 28 for standalone chip testing. Input vectors 22 are applied to the inputs of FPGA 12 on its respective input pins and FPGA 12 provides output 32 on its respective output pins. Outputs 32 are then compared with verification vectors 24 to determine if the test was successful. Standalone chip testing environment 16 provides full control over the inputs and outputs of FPGA 12 which enables robust coverage of fault conditions and abnormal operating conditions.

In an embodiment, standalone chip testing environment 16 includes a motherboard and a daughterboard that may be installed within a computer system. FPGA 12 interfaces with the daughterboard during standalone chip testing. The motherboard interfaces with the daughterboard to provide input vectors 22 from vector test software 30 to FPGA 12. The motherboard receives output vectors 32 from the daughterboard and provides output vectors 32 to vector test software 30. Vector test software 30 compares output vectors 32 with verification vectors 24 to verify the hardware implementation of design 26 on FPGA 12.

An analysis of the requirements of FPGA 12 is performed to determine and select which requirements should be verified using full system integration testing on integrated system 18. FPGA requirements may fall into two categories. The first category being requirements that are not influenced by the dynamics of integrated system 18. For this first category, the boundary of the "intended operational environment," as defined in DO-254, is limited to FPGA 12 itself. These requirements define basic FPGA functionality that is explicit, deterministic and timing independent with respect to FPGA inputs. Verification of these requirements is performed to ensure the "burn file" programmed into FPGA 12, provided by the synthesis tool and place-and-route tool, accurately implements the gate level logic described by the HDL in the DUT. For example, requirements such as a signal being set upon reset, an output being driven based upon an equation, or a clock that is driven based upon an internal signal are examples of test cases that fall under this category. Tests within this category can be executed and verified using only standalone chip testing environment 16.

The second category of tests includes requirements that are influenced by the dynamics of integrated system 18. For this category, the boundary of the "intended operational environment," as defined in DO-254, is expanded to include the full integrated system 18 because operation of integrated system 18 outside of FPGA 12 will influence the operation and results of FPGA 12. These requirements define complex or dynamic FPGA functionality that is dependent upon how the overall system operates such as closed loop operation or timing parameters. Verification of these requirements are intended to ensure that implementation of FPGA 12 properly integrates with integrated system 18. For example, test cases such as an FPGA input needing to be deglitched, an AC input needing to be integratively filtered, or an FPGA input needing to be monitored for a given time period should be tested in integrated system 18 because they all depend upon the dynamics of integrated system 18. While described with respect to DO-254, analysis of FPGA requirements may be performed using any airborne electronic hardware certification specification.

FPGA 12 is installed within integrated system 18 to perform full system integration testing for the selected group of requirements that fall under the second category. FPGA 12 may be tested within integrated system 18 using any known method. By performing verification using both standalone chip testing environment 16 along with full system tests on integrated system 18, all requirements and aspects of FPGA 12 are able to be completely tested in hardware in each requirement's "intended operational environment." Many fault conditions are unable to be tested in full system testing of integrated system 18, and thus have been tested only in simulation in the past. Using standalone chip testing environment 16, fault conditions can now be fully tested in hardware due to the complete control of the inputs and outputs of FPGA 12 in standalone chip testing environment 16.

Full system testing on integrated system 18 may incur high costs and require a significant amount of time. In the past, verification of FPGA 12 under the DO-254 standard, or any other airborne electronic hardware certification standard, involved performing all hardware testing on integrated system 18. Because test cases falling into the first category are not dependent upon the dynamics of integrated system 18, these test cases can be run and verified within standalone chip testing environment 16 while still complying with airborne electronic hardware certification standards. By reducing the number of test cases run on integrated system 18, a significant reduction in time and cost to verify FPGA 12 is accomplished, while still satisfying the airborne electronic hardware certification standards.

Figure 2:
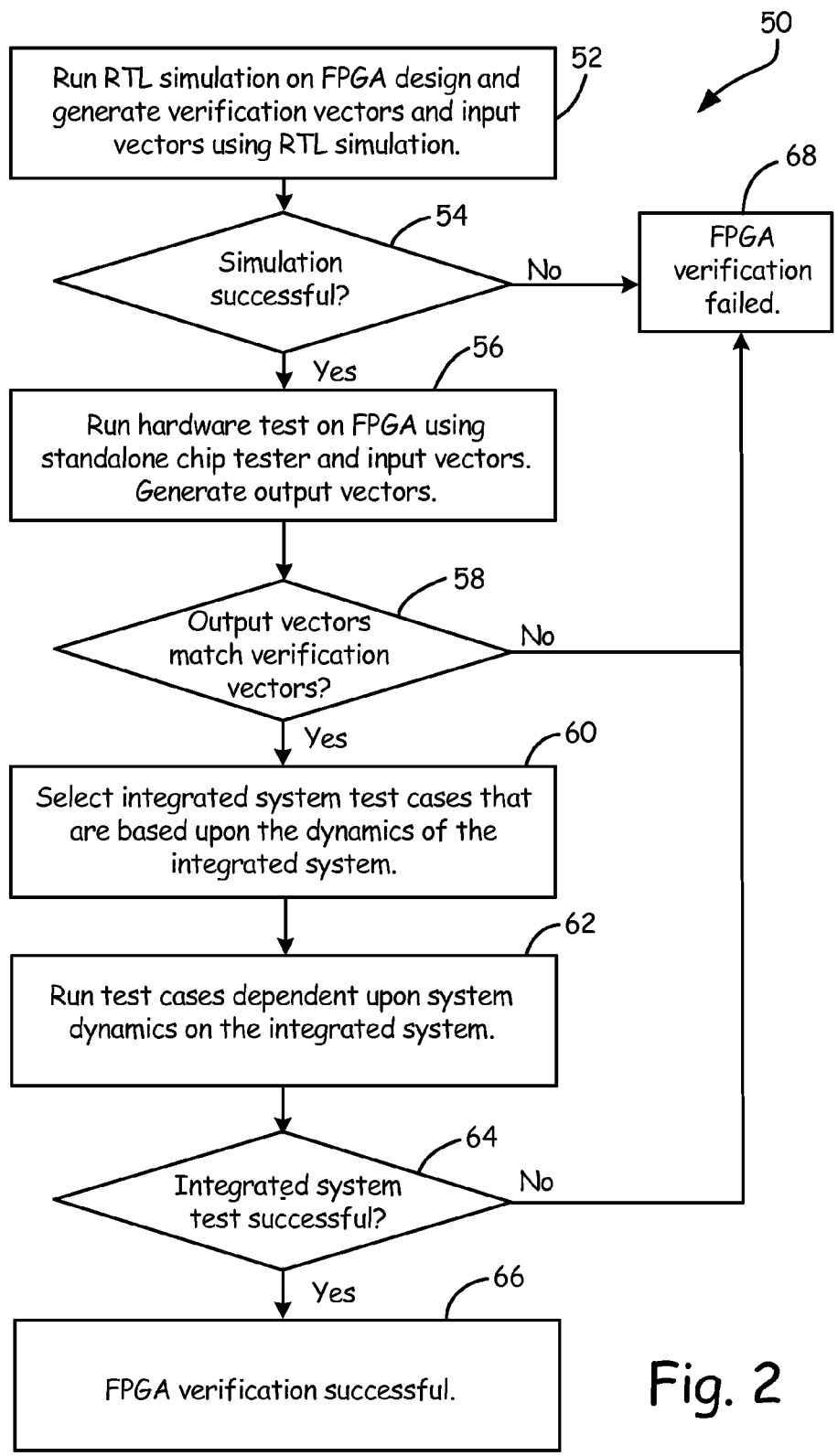
FIG. 2 is a flowchart illustrating a method for performing verification of a field-programmable gate array.

With continued reference to FIG. 1, FIG. 2 is a flowchart illustrating method 50 for performing verification of FPGA 12. At step 52, design and test bench 26 are run using RTL simulation software 20. Input vectors 22 and verification vectors 24 are generated by RTL simulation software 20. At step 54, it is determined if the simulation run on RTL simulation software 20 was successful. If the simulation failed, method 50 proceeds to step 68 to indicate verification of FPGA 12 has failed. If the simulation was successful, method 50 proceeds to step 56. At step 56, FPGA 12 is tested within standalone chip testing environment 16 using input vectors 22 generated by RTL simulation software 20. Output vectors 32 are generated during the test. Output vectors 32 are compared with verification vectors 24 generated by RTL simulation software 20. At step 58, if output vectors 32 match verification vectors 24, method 50 proceeds to step 60. If output vectors 32 do not match verification vectors 24, method 50 proceeds to step 68 to indicate that the verification of FPGA 12 has failed. At step 60, a subset of requirements is determined that are based upon the dynamics of integrated system 18. An embodiment of the assessment performed at step 60 is illustrated in more detail in FIG. 3. At step 62, tests developed to verify the identified subset of requirements are run on integrated system 18. At step 64, if the integrated system tests are successful, method 50 proceeds to step 66 and FPGA 12 has been successfully verified. If the integrated system tests are unsuccessful, method 50 proceeds to step 68 to indicate that the verification of FPGA 12 has failed. While illustrated at step 60, because a test plan that includes the desirable test cases may be generated prior to performance of method 50, selection of integrated system requirements can be performed at any point within method 50.

Figure 3:
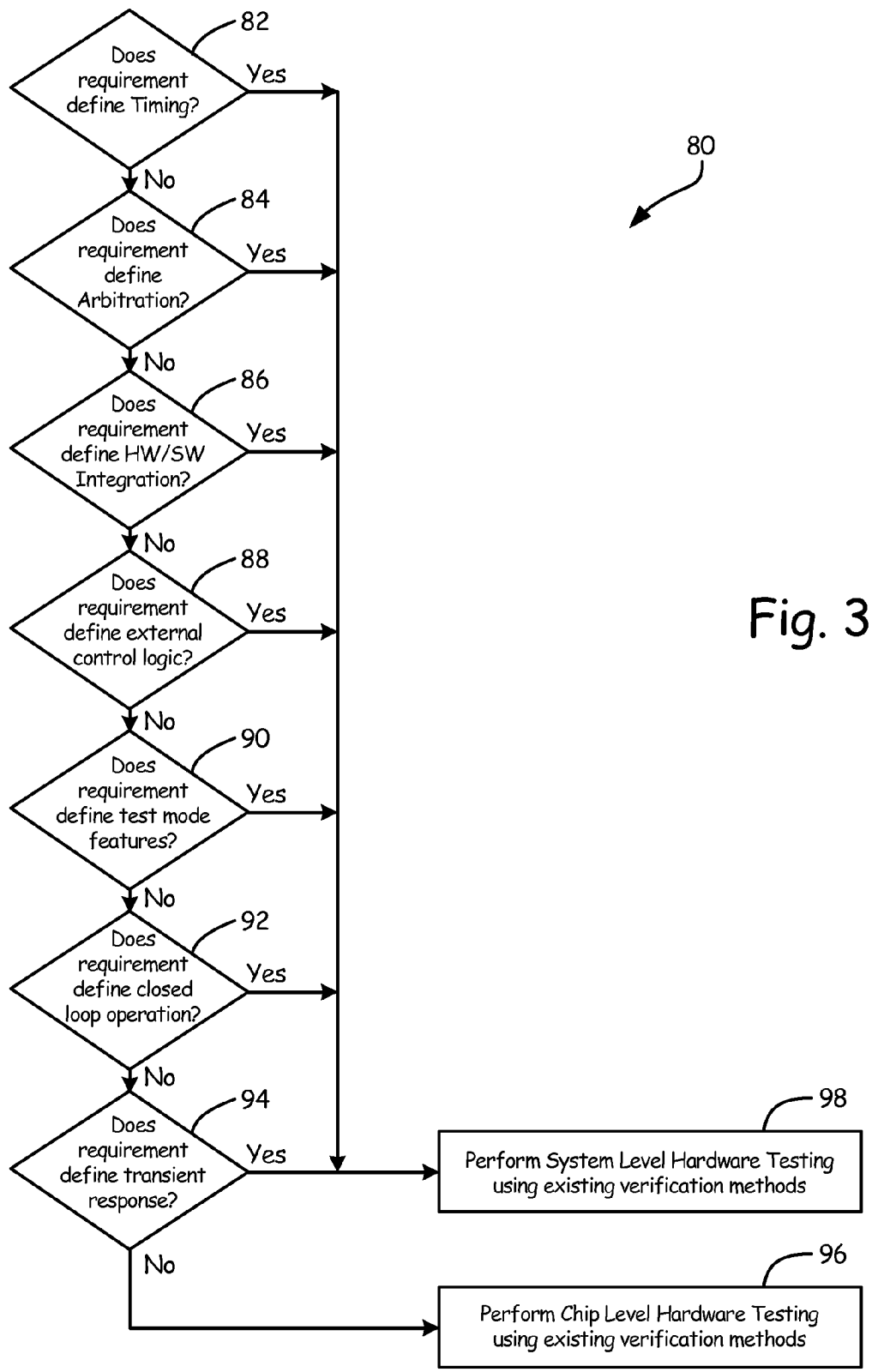
FIG. 3 is a flowchart illustrating a method for assessing field-programmable gate array requirements.

FIG. 3 is a flowchart illustrating method 80 for assessing field-programmable gate array requirements. Assessment criteria for determining whether an FPGA requirement is influenced by the dynamics of integrated system 18 may include, among others, timing, arbitration, hardware/software integration, external control, test mode features, closed loop operation, and transient response criteria.

At step 82, it is determined if the FPGA requirement is a time based requirement. Timing criteria address requirements that define critical timing parameters that are integral to the proper operation of integrated system 18. For example, write cycle timing for external random access memory access is dependent upon the dynamics of integrated system 18. If the requirement defines timing, method 80 proceeds to step 98 and the FPGA requirement is selected for testing on integrated system 18. If the requirement does not define timing, method 80 proceeds to step 84.

At step 84, it is determined if the FPGA requirement is an arbitration based requirement. Arbitration control criteria address requirements that define external arbitration control. For example, proper access of a shared data bus external to FPGA 12 with at least one external bus requestor is dependent upon the dynamics of integrated system 18. If the requirement defines arbitration, method 80 proceeds to step 98 and the FPGA requirement is selected for testing on integrated system 18. If the requirement does not define arbitration, method 80 proceeds to step 86.

At step 86, it is determined if the FPGA requirement is a hardware/software integration based requirement. Hardware/software integration criteria address requirements that define integration between hardware and software, such as software reading from internal FPGA registers. If the requirement defines hardware/software integration, method 80 proceeds to step 98 and the FPGA requirement is selected for testing on integrated system 18. If the requirement does not define arbitration, method 80 proceeds to step 88.

At step 88, it is determined if the FPGA requirement defines external control logic. External controls criteria address requirements that define controls for externally managed components. For example, automatic configuration settings for an Ethernet controller are influenced by the dynamics of integrated system 18. If the requirement defines external control logic, method 80 proceeds to step 98 and the FPGA requirement is selected for testing on integrated system 18. If the requirement does not define external control logic, method 80 proceeds to step 90.

At step 90, it is determined if the FPGA requirement defines test mode features. Test mode features criteria address requirements that define features that are locked out during normal system operation. For example, test modes that are enabled during simulation but should not be enabled in integrated system 18 are requirements that should be tested within integrated system 18. If the requirement defines test mode features, method 80 proceeds to step 98 and the FPGA requirement is selected for testing on integrated system 18. If the requirement does not define test mode features, method 80 proceeds to step 92.

At step 92, it is determined if the FPGA requirement defines closed loop operation. Closed loop operation criteria address requirements that define an output based on loop feedback, or closed loop control that depends on, or defines dynamics of integrated system 18. If the requirement defines closed loop operation, method 80 proceeds to step 98 and the FPGA requirement is selected for testing on integrated system 18. If the requirement does not define closed loop operation, method 80 proceeds to step 94.

At step 94, it is determined if the FPGA requirement is a transient response requirement. Transient response criteria address requirements that define the response of FPGA 12 to input transients. For example, filters implemented on input signals of FPGA 12 are influenced by the dynamics of integrated system 18. If the requirement defines transient response, method 80 proceeds to step 98 and the FPGA requirement is selected for testing on integrated system 18. If the requirement does not define transient response, method 80 proceeds to step 96 and the requirement is selected for verification by standalone chip testing environment 16.

Discussion of Possible Embodiments

The following are non-exclusive descriptions of possible embodiments of the present invention.

A method of verifying a field programmable gate array for use in an integrated system includes selecting, from a set of requirements of the field programmable gate array, a first subset of the requirements that are not influenced by dynamics of the integrated system; selecting, from the set of requirements of the field programmable gate array, a second subset of the requirements that are influenced by the dynamics of the integrated system; executing a hardware test on the field programmable gate array using a chip tester that verifies the first subset of the requirements; and executing a hardware test on the field programmable gate array to verify the second subset of the requirements while the field programmable gate array is installed within the integrated system.

The method of the preceding paragraph can optionally include, additionally and/or alternatively, any one or more of the following features, configurations and/or additional components:

The method further includes generating, on a computer system, a set of input vectors using a register-transfer level simulation, and generating, on the computer system, a set of verification vectors for the respective input vectors using the register-transfer level simulation. Executing a hardware test on the field programmable gate array includes providing the input vectors to the field programmable gate array using the chip tester, and comparing output of the field programmable gate array with the verification vectors using the computer system to verify the first subset of the requirements.

The method further includes running the register-transfer level simulation to verify a design loaded to the field programmable gate array.

Comparing the output of the field programmable gate array with the verification vectors includes comparing the output vectors with the verification vectors using a vector test software run on the computer system.

None of the first subset of the requirements includes a timing requirement, an arbitration requirement, a hardware/software integration requirement, an external logic control requirement, a test mode feature requirement, a closed loop operation requirement, or a transient response requirement.

Each of the second subset of the requirements includes one or more of a timing requirement, an arbitration requirement, a hardware/software integration requirement, an external logic control requirement, a test mode feature requirement, a closed loop operation requirement, and a transient response requirement.

A system for verifying a field programmable gate array for use in an airborne integrated system includes, among other things: a standalone chip tester, and an integrated system test environment. The field programmable gate array is interfaced with the standalone chip tester to verify a first set of requirements. A set of tests are run on the field programmable gate array while the field programmable gate array is installed within the integrated system to verify a second set of requirements. The first set of requirements are not influenced by dynamics of the integrated system, and the second set of requirements are influenced by dynamics of the integrated system.

The system of the preceding paragraph can optionally include, additionally and/or alternatively, any one or more of the following features, configurations and/or additional components:

A computer system that executes a simulation of a design-under-test. The computer system generates input vectors and verification vectors based upon the simulation. The input vectors are provided to the field programmable gate array to verify the first set of requirements.

The standalone chip tester further includes vector test software that generates output vectors based upon output of the field programmable gate array. The vector test software compares the verification vectors with the output vectors to verify the first set of requirements.

The vector test software is installed on the computer system.

The computer system is configured to execute the simulation of the design-under-test based upon a test bench.

The input vectors are further generated based upon the test bench.

None of the first set of requirements include a timing requirement, an arbitration requirement, a hardware/software integration requirement, an external logic control requirement, a test mode feature requirement, a closed loop operation requirement, or a transient response requirement.

Each of the second set of requirements include one or more of a timing requirement, an arbitration requirement, a hardware/software integration requirement, an external logic control requirement, a test mode feature requirement, a closed loop operation requirement, and a transient response requirement.

A method of verifying a field programmable gate array for compliance with an airborne electronic hardware standard includes, among other things: selecting a first set of requirements of the field programmable gate array; selecting a second set of requirements of the field programmable gate array; installing the field programmable gate array into a standalone chip tester; verifying, by the standalone chip tester, the first set of requirements; and installing the field programmable gate array into the integrated system; and executing tests on the integrated system to verify the second set of requirements. The first set of requirements are not dependent upon dynamics of an integrated system for which the field programmable gate array is designed. The second set of requirements are dependent upon the dynamics of the integrated system for which the field programmable gate array is designed.

The method of the preceding paragraph can optionally include, additionally and/or alternatively, any one or more of the following features, configurations and/or additional components:

The method further includes executing a simulation of a design-under-test using simulation software and a test bench run on a computer system; generating input vectors and verification vectors based upon results of the simulation and the test bench; providing the input vectors to the field programmable gate array while the field programmable gate array is installed into the standalone chip tester; and comparing, with the verification vectors, output vectors generated by the field programmable gate array while installed in the standalone chip tester.

Comparing the output vectors includes comparing the output vectors with the verification vectors to verify the first set of requirements.

Comparing the output vectors includes comparing the output vectors with the verification vectors using a vector test software run on the computer system.

None of the first set of requirements include a timing requirement, an arbitration requirement, a hardware/software integration requirement, an external logic control requirement, a test mode feature requirement, a closed loop operation requirement, or a transient response requirement.

Each of the second set of requirements include one or more of a timing requirement, an arbitration requirement, a hardware/software integration requirement, an external logic control requirement, a test mode feature requirement, a closed loop operation requirement, and a transient response requirement.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of verifying a field programmable gate array for use in an integrated system, the method comprising:
   selecting, by a computer, from a set of requirements of the field programmable gate array, a first subset of the requirements that are not influenced by dynamics of the integrated system and are explicit, deterministic and timing independent with respect to inputs of the field programmable gate array;
   selecting, from the set of requirements of the field programmable gate array, a second subset of the requirements that are influenced by the dynamics of the integrated system and comprise one or more of a timing requirement, an arbitration requirement, a hardware/software integration requirement, an external logic control requirement, a test mode feature requirement, a closed loop operation requirement, and a transient response requirement;
   executing a first hardware test on the field programmable gate array using a chip tester circuit board that verifies the first subset of the requirements; and
   executing a second hardware test on the field programmable gate array to verify the second subset of the requirements while the field programmable gate array is installed within the integrated system.

2. The method of claim 1, further comprising:
   generating, on a computer system, a set of input vectors using a register-transfer level simulation; and
   generating, on the computer system, a set of verification vectors for the respective input vectors using the register-transfer level simulation; and
   wherein executing a first hardware test on the field programmable gate array comprises:
      providing the input vectors to the field programmable gate array using the chip tester circuit board; and
      comparing output of the field programmable gate array with the verification vectors using the computer system to verify the first subset of the requirements.

3. The method of claim 2, further comprising running the register-transfer level simulation to verify a design loaded to the field programmable gate array.

4. The method of claim 2, wherein comparing the output of the field programmable gate array with the verification vectors comprises comparing the output vectors with the verification vectors using a vector test software run on the computer system.

5. The method of claim 1, wherein none of the first subset of the requirements comprises a timing requirement, an arbitration requirement, a hardware/software integration requirement, an external logic control requirement, a test mode feature requirement, a closed loop operation requirement, or a transient response requirement.

6. A system for verifying a field programmable gate array for use in an airborne integrated system, the system comprising:
 a standalone chip tester circuit board, wherein the field programmable gate array is interfaced with the standalone chip tester to verify a first set of requirements; and
 an integrated system test environment comprising at least one processor, wherein a set of tests are run on the field programmable gate array while the field programmable gate array is installed within the integrated system to verify a second set of requirements; and
 wherein the first set of requirements are not influenced by dynamics of the integrated system and are explicit, deterministic and timing independent with respect to inputs of the field programmable gate array, and wherein each of the second set of requirements are influenced by dynamics of the integrated system and comprise one or more of a timing requirement, an arbitration requirement, a hardware/software integration requirement, an external logic control requirement, a test mode feature requirement, a closed loop operation requirement, and a transient response requirement.

7. The system of claim 6, further comprising a computer system that executes a simulation of a design-under-test, wherein the computer system generates input vectors and verification vectors based upon the simulation, and wherein the input vectors are provided to the field programmable gate array to verify the first set of requirements.

8. The system of claim 7, wherein the vector test software is installed on the computer system.

9. The system of claim 7, wherein the computer system is configured to execute the simulation of the design-under-test based upon a test bench.

10. The system of claim 9, wherein the input vectors are further generated based upon the test bench.

11. The system of claim 6, wherein none of the first set of requirements comprises a timing requirement, an arbitration requirement, a hardware/software integration requirement, an external logic control requirement, a test mode feature requirement, a closed loop operation requirement, or a transient response requirement.

12. A method of verifying a field programmable gate array for compliance with an airborne electronic hardware standard, the method comprising:

selecting by a computer a first set of requirements of the field programmable gate array, wherein the first set of requirements are not dependent upon dynamics of an integrated system for which the field programmable gate array is designed and are explicit, deterministic and timing independent with respect to inputs of the field programmable gate array;
 selecting a second set of requirements of the field programmable gate array, wherein the second set of requirements are dependent upon the dynamics of the integrated system for which the field programmable gate array is designed and comprise one or more of a timing requirement, an arbitration requirement, a hardware/software integration requirement, an external logic control requirement, a test mode feature requirement, a closed loop operation requirement, and a transient response requirement;
 installing the field programmable gate array into a standalone chip tester;
 verifying, by the standalone chip tester, the first set of requirements;
 installing the field programmable gate array into the integrated system; and
 executing tests on the integrated system to verify the second set of requirements.

13. The method of claim 12, further comprising:
 executing a simulation of a design-under-test using simulation software and a test bench run on a computer system;
 generating input vectors and verification vectors based upon results of the simulation and the test bench;
 providing the input vectors to the field programmable gate array while the field programmable gate array is installed into the standalone chip tester; and
 comparing, with the verification vectors, output vectors generated by the field programmable gate array while installed in the standalone chip tester.

14. The method of claim 13, wherein comparing the output vectors comprises comparing the output vectors with the verification vectors to verify the first set of requirements.

15. The method of claim 14, wherein comparing the output vectors comprises comparing the output vectors with the verification vectors using a vector test software run on the computer system.

16. The method of claim 12, wherein none of the first set of requirements comprises a timing requirement, an arbitration requirement, a hardware/software integration requirement, an external logic control requirement, a test mode feature requirement, a closed loop operation requirement, or a transient response requirement.

\* \* \* \* \*